May 27, 1969 E. F. BRANAGAN 3,447,039

ELECTRONIC CIRCUIT TEST BOARD

Filed Feb. 28, 1967

INVENTOR
Edward F. Branagan

BY J. O. Tresansky
ATTORNEY
H. R. Booker
AGENT

United States Patent Office 3,447,039

Patented May 27, 1969

3,447,039

ELECTRONIC CIRCUIT TEST BOARD

Edward F. Branagan, 11908 Rockinghorse Road, Rockville, Md. 20853

Filed Feb. 28, 1967, Ser. No. 619,906
Int. Cl. H02b 1/04
U.S. Cl. 317—101 9 Claims

ABSTRACT OF THE DISCLOSURE

An electronic components mounting and electrically connecting board having solderless connections. The board has rubber grommets fitted into holes cut in the board and uses metal interconnecting plugs to connect electrical component leads together in the grommets.

The invention described herein may be manufactured and used by or for the Government of the United States of America for governmental purposes without the payment of any royalties thereon or therefor.

*Background of the invention*

This invention relates to electronic circuit boards and more specifically to circuit boards which mount electrical components with solderless electrical connections.

In the past electrical bread-boarding techniques for mounting test or training circuits have required soldering of the component leads to insure good electrical connections. For example, test boards have been made by fabricating a metal chassis with insulators mounted by metal screws and then soldering the electrical components to the insulators or boards have been built by fastening metal stand-off terminals to phenolic boards with machine nuts and then soldering the components to the terminals. Attempts have been made to hold the leads without solder connections, but normally these have been either by using press-fit spring terminals in pre-punched hardboard or with press fit rubber tubing in eyelet holes to hold the leads.

Test and training boards requiring solder connections have been widely used and have been satisfactory in many respects, but it has long been desirable to have a circuit board which required no soldering to mount the components but which at the same time maintained a good electrical connection. Soldering connections involved not only a great deal of time in assembly and disassembly of the test circuits, but also often thermally damaged the components. Using spring or rubber tubing terminals served to eliminate solder connections but had the disadvantage of providing poor electrical connections because of insufficient contact pressure against the wires or component leads. Spring terminals could not accommodate different wire or component lead diameters since the larger leads would often take all the contact pressure. The eyelet tubing connection often failed to create sufficient radial pressure against lead wires and did not permit interconnection beneath the upper surface of the component board. Both of these solderless connections also made high resistance connections. Finally it should be pointed out that none of the prior art test boards lent themselves to three dimensional stacking arrangements to conserve testing space.

It is an object therefore to overcome the foregoing limitations and difficulties by providing a novel electronic circuit mounting and electrical connecting board; furthermore, to provide a new method of connecting electrical components on circuit boards and a novel method of using a plurality of test boards to conserve testing space.

*Summary of the invention*

A novel circuit test board is attained by fabricating a mounting board with a plurality of holes having rubber grommets and a number of conductive metal plugs which fit into the grommet openings. Electrical components of the nature of resistors, capacitors, relays, transistors, electronic tubes, etc., can be connected together to form numerous circuit configurations. Essentially each connector on the test board comprises a compressible rubber female member and a metallic conductive plug which can be inserted into the female member to clamp leads of components into electrical contact and at the same time mount the components on the circuit board. This enables electrical circuits to be mounted on testing or educational display or training boards without soldering the connections but still maintaining very good low resistivity connections. It allows rapid assembly and disassembly of electrical components, providing a convenient, reliable and non-destructive method of assembling test circuits. It also permits a plurality of circuit boards to be stacked on top of each other requiring a minimum of space for testing, training or display purposes.

*Brief description of the drawings*

The foregoing and other objects, features and attendant advantages of the invention will be readily appreciated as the same becomes better understood by reference to the accompanying drawing wherein.

*Detailed description*

Figures 1, 2, 3A, 3B, 4A, 4B:
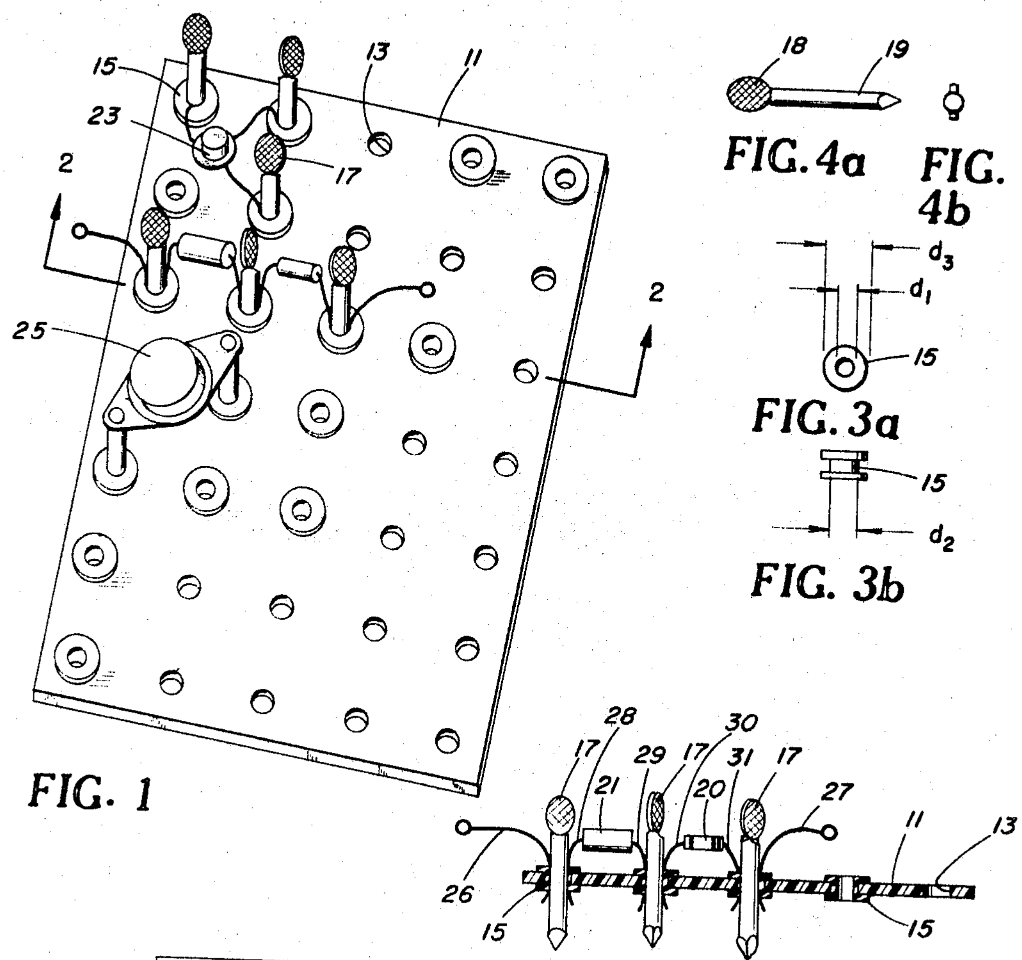
FIG. 1 is a top view of a test board illustrating one embodiment of the invention.
FIG. 2 is a cross-sectional view of FIG. 1.
FIGS. 3*a* and 3*b* are top and side views of a rubber grommet used in the embodiment shown in FIG. 1.
FIGS. 4*a* and 4*b* are side and end views of the metal plug used in the embodiment of FIG. 1.

Referring now to the drawings, FIG. 1 shows an insulated circuit board 11 with several rows of holes 13 punched, drilled or cut out of the board according to a predetermined convenient spacing arrangement. For purposes of illustration a board having seven rows and five columns is shown, although the number of holes and their spacing is a matter of choice. Several of the holes have rubber grommets 15 with the configuration shown in FIG. 3 secured in them. The inside diameter $d_1$ is chosen to be an amount which permits the entrance of conventional test circuit plugs and component plugs and the outside diameter $d_2$ is chosen to be approximately the same as the drilled holes 13. The part of the grommet which makes up the difference between diameter $d_3$ and diameter $d_2$ overlies the test board on both the top and bottom.

A metal plug 17 is made from a metal with good conductive properties and low resistivity. Copper, for example, has been found to work satisfactorily. The plug 17 has a portion 19 which can be inserted into the grommets and a knurled head 18 for manual grasping of the plug during insertion or removal from the board.

Practically any electronic circuit imaginable can be mounted on one or more of the circuit boards. For purposes of illustration an RC circuit comprising resistor 20 and capacitor 21 are shown as a simple circuit connected on the board. A transistor 23 and a switch 25 having standard plug attachments are also shown connected up in a test circuit in FIG. 1.

FIG. 2 is a cross-sectional view of row 3 of FIG. 1 and serves to illustrate the novel connecting feature of the invention. A resistor and capacitor could be connected into simple series circuit with input leads 26 and 27 by simply placing leads 26, 27, 28, 29, 30 and 31 into the grommet holes as shown and inserting the three metal plugs. When the plugs are inserted any oxide formation is scraped clean and a good electrical connection is made. For a still easier insertion of plugs into grommet openings it has been found that applying a thin film of silicone either on the grommet inside annular surface or on the plug facilities the connection and provides a still better electrical connection by preventing formation of oxides on the scraped off portions of the component leads.

Figure 5:
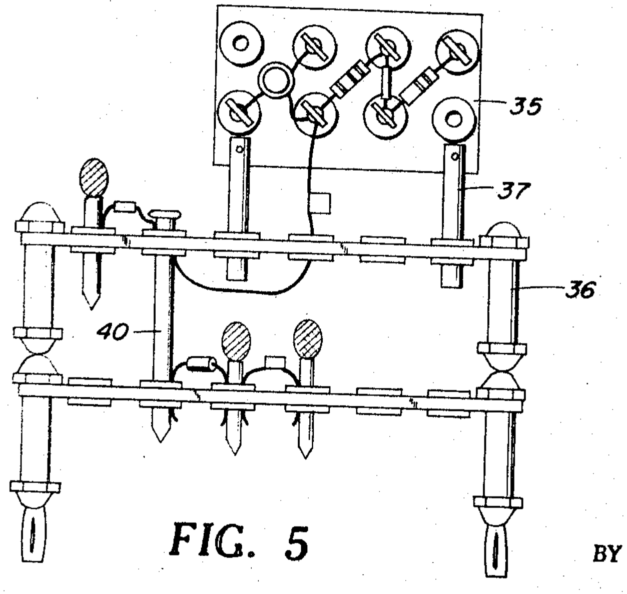
FIG. 5 is a side view of a plurality of test boards illustrating a method of using the invention.

FIG. 5 shows how a plurality of test boards may be stacked on top of each other. Extremely complex circuit designs can be neatly arranged in a small amount of space enabling the experimenter to move the circuit from place to place, to add or remove complete modules 35 or to stack circuits on top of each other in a multilayer arrangement. Structural support for the test boards may be provided by connectors such as 36 or 37 and electrical connections from board to board may be through elongated conductors such as electrical plug 40 which extends through aligned grommets in two or more layers of boards. With this arrangement, also, it is convenient to connect leads from the underside of the board as well as the top so that if a great deal of wiring connections are required, a neater display of circuit components can be maintained on the top side.

From the foregoing it is obvious that the invention provides many new features and advantages over prior art devices. The embodiments shown, however, are merely preferred embodiments and not intended to limit the scope of the invention as set forth in the claims. For example, although an insulating board is disclosed, a metal chassis could be used. Also, instead of rubber grommets plastic or other elastically compressible insulating material could be used. The board material chosen depends on the type of electrical operation. For either D.C. or low frequency operation, plastic or fiberboard circuit boards are preferable, but with UHF applications metal is desirable.

It is therefore to be understood that within the scope of the appended claims the invention may be practiced otherwise than as specifically described.

I claim:

1. An electronic circuit assembly for mounting and electrically connecting electrical components comprising:
- a mounting board having a plurality of holes therein,
- a plurality of resiliently deformable insulating surfaces forming, the entirety of at least some of the plurality of holes of said mounting board, and
- a plurality of conductive plugs, each of said plugs being removably insertable into the holes formed by said surfaces and each of said surfaces resiliently holding at least one component conducting lead between said surface and plug and in electrical contact with said plug when a plug and lead are inserted therein.

2. The assembly of claim 1 wherein said mounting board is an insulating board and wherein said plurality of holes have predetermined diameters therein and wherein said resiliently deformable insulating surfaces are rubber grommets, each of said grommets having a diameter less than said predetermined diameter.

3. The assembly of claim 1 for mounting and electrically connecting VHF electrical components wherein said mounting board is metal and said insulating surfaces are rubber grommets.

4. An electrical components insulating and mounting circuit board comprising a flat insulating board having a plurality of holes therethrough arranged in rows and columns thereon and insulating elastomeric grommets receptive to resiliently hold conductive leads of variable wire sizes and conductive plugs inserted therein.

5. An electronic components mounting and electrically connecting circuit board comprising a flat mounting board having a plurality of rows of holes therethrough, insulating elastomeric grommets mounted in some of said holes, and conductive plug means for mounting at least one electrical component between any two of said grommets and electrically connecting at least two electrical components at any one of said grommets.

6. An electronic circuit assembly as in claim 1 wherein said plurality of resiliently deformable insulating surfaces are selectively removable and of annular shape.

7. An electronic assembly as in claim 1 wherein said plurality of conductive plugs are coated with a thin film of conducting lubricant.

8. A multilayer electronic assembly comprising:
- a plurality of electrical circuit boards each of which is capable of mounting components with solderless connections, and
- solderless means for physically mounting each of said boards atop another and for simultaneously effecting electrical communication between at least one component mounted on one of said plurality of boards with at least one component mounted on another one of said plurality of boards.

9. A multilayer electronic assembly as in claim 8
- wherein said plurality of boards have holes formed therein,
- wherein is included a plurality of annular elastic members mounted in at least some of said holes of said plurality of boards, and
- wherein said solderless means is an elongated conductive plug which is connected from one of said annular elastic member mounted in said one of said plurality of boards to another of said annular elastic members mounted in said another of said plurality of boards.

References Cited

UNITED STATES PATENTS

| | | | |
|---|---|---|---|
| 3,088,191 | 5/1963 | Breiling. | |
| 3,148,356 | 9/1964 | Hedden. | |
| 3,202,755 | 8/1965 | Oswald. | |
| 3,235,830 | 2/1966 | Newton | 339—18 |

LEWIS H. MYERS, *Primary Examiner.*

J. R. SCOTT, *Assistant Examiner.*

U.S. Cl. X.R.

174—68.5; 339—18